(12) United States Patent
Takano (10) Patent No.: US 12,072,375 B2
(45) Date of Patent: Aug. 27, 2024

(54) SEMICONDUCTOR INTEGRATED CIRCUIT

(71) Applicant: Yoichi Takano, Hadano (JP)

(72) Inventor: Yoichi Takano, Hadano (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 18/462,639

(22) Filed: Sep. 7, 2023

(65) Prior Publication Data

US 2023/0417827 A1 Dec. 28, 2023

Related U.S. Application Data (63) Continuation of application No. 17/817,022, filed on Aug. 3, 2022, now Pat. No. 11,782,087.

(30) Foreign Application Priority Data

Aug. 5, 2021 (JP) .................................. 2021-128681
Sep. 15, 2021 (JP) .................................. 2021-150535

(51) Int. Cl.
*G01R 31/28* (2006.01)
*H03K 5/24* (2006.01)

(52) U.S. Cl.
CPC ........... *G01R 31/2884* (2013.01); *H03K 5/24* (2013.01)

(58) Field of Classification Search
CPC .... G01R 31/2884; G01R 31/52; G01R 31/54; H03K 5/24
USPC ............ 324/750.3, 754.21, 754.01, 537, 500
See application file for complete search history.

(56) References Cited

U.S. PATENT DOCUMENTS

| 11,782,087 B2 * | 10/2023 | Takano ................. G01R 31/52 |
| | | 324/750.3 |
| 11,797,036 B2 * | 10/2023 | Yang ........................ G01R 1/30 |
| 2008/0265852 A1 | 10/2008 | Imura |
| 2020/0200831 A1 * | 6/2020 | Chen ....................... H02M 1/32 |
| 2021/0223306 A1 | 7/2021 | Rowling |
| 2022/0075403 A1 | 3/2022 | Sakurai |

FOREIGN PATENT DOCUMENTS

| JP | 2010-010527 A | 1/2010 |
| JP | 2017-045096 A | 3/2017 |
| JP | 2018-055545 A | 4/2018 |

* cited by examiner

*Primary Examiner* — Giovanni Astacio-Oquendo
(74) *Attorney, Agent, or Firm* — Shih IP Law Group, PLLC (57) ABSTRACT

A semiconductor integrated circuit includes: one input terminal; multiple output terminals; multiple first current control elements connected between the input terminal and the respective output terminals; a control circuit that controls the first current control elements; a fault detection circuit that includes multiple voltage comparator circuits each of which compares a voltage proportional to a voltage of one of the output terminals with a predetermined threshold voltage and that detects an open-circuit state or a short-circuit state of the output terminals; an external terminal connected to an external resistor; a voltage convertor circuit that generates the threshold voltage according to a voltage of the external terminal that is generated by flowing a current through the external resistor, the threshold voltage being applied to an input terminal of each of the voltage comparator circuits; and a detection result output terminal for outputting a detection result by the fault detection circuit.

9 Claims, 6 Drawing Sheets

SEMICONDUCTOR INTEGRATED CIRCUIT

CROSS-REFERENCE TO RELATED APPLICATIONS

The present application is a Continuation Application of application Ser. No. 17/817,022, filed Aug. 3, 2022, which claims priority from Japanese Patent Applications No. 2021-128681 filed on Aug. 5, 2021 and No. 2021-150535 filed on Sep. 15, 2021, the entire disclosures of which are incorporated herein by reference.

BACKGROUND

The present disclosure relates to a semiconductor integrated circuit that includes a current control element connected between an input terminal and an output terminal, and further relates to a power supply semiconductor integrated circuit (power supply IC) that constitutes a DC power supply device, such as a DC-DC converter a voltage regulator for converting DC voltage. The present disclosure relates to a technology effectively applicable to a configuration that includes multiple output terminals for connection to loads and that detects an open-circuit fault or a short-circuit fault of the output terminals or the loads.

TECHNOLOGICAL FIELD

A series regulator (hereinafter called regulator) is a power supply device that outputs a DC voltage at a desired electric potential by controlling a transistor provided between a DC voltage input terminal and an output terminal.

In a vehicle mounted with a Digital Terrestrial Television Broadcasting (DTTB) tuner, an on-vehicle regulator supplies electric power to on-vehicle electronic devices including a DTTB antenna. The on-vehicle DTTB tuner, which is compatible with full segment digital broadcasting, adjusts reception sensitivity and switches between full-segment digital broadcasting and one-segment digital broadcasting. To optimize reception conditions, a diversity antenna equivalent to four channels is generally used as the DTTB antenna.

The on-vehicle tuner/antenna is connected to the on-vehicle regulator via a connector. Owing to vibration of the vehicle, the connector may be disconnected, leaving the output terminal of the power supply open or causing a short circuit or disconnection of wires in the load. To deal with this, there are on-vehicle regulators configured to detect such faults.

For example, JP2010-10527A and JP2017-45096A disclose an invention that relates to a semiconductor integrated circuit for a regulator (regulator IC). The regulator IC includes a comparator for detecting an open circuit of the output terminal and a comparator for detecting a short circuit of the output terminal. The regulator IC generates and outputs fault detection signals from the output terminal.

SUMMARY

In the known art, an on-vehicle DTTB system with multiple antennas generally supplies electrical power from a common regulator to the multiple antennas. When any one of antennas corresponding to one channel is open in the system, the other antennas corresponding to the other channels can perform reception. Therefore, the DTTB system keeps operating without detecting the fault. On the other hand, in order to detect an open circuit of any one channel antenna, a DTTB system may be provided with regulators configured to detect open-circuit faults for the respective antennas (loads). However, such a configuration requires multiple regulators. This may result in substantial cost increase and a wider mounting area.

Figure 6:
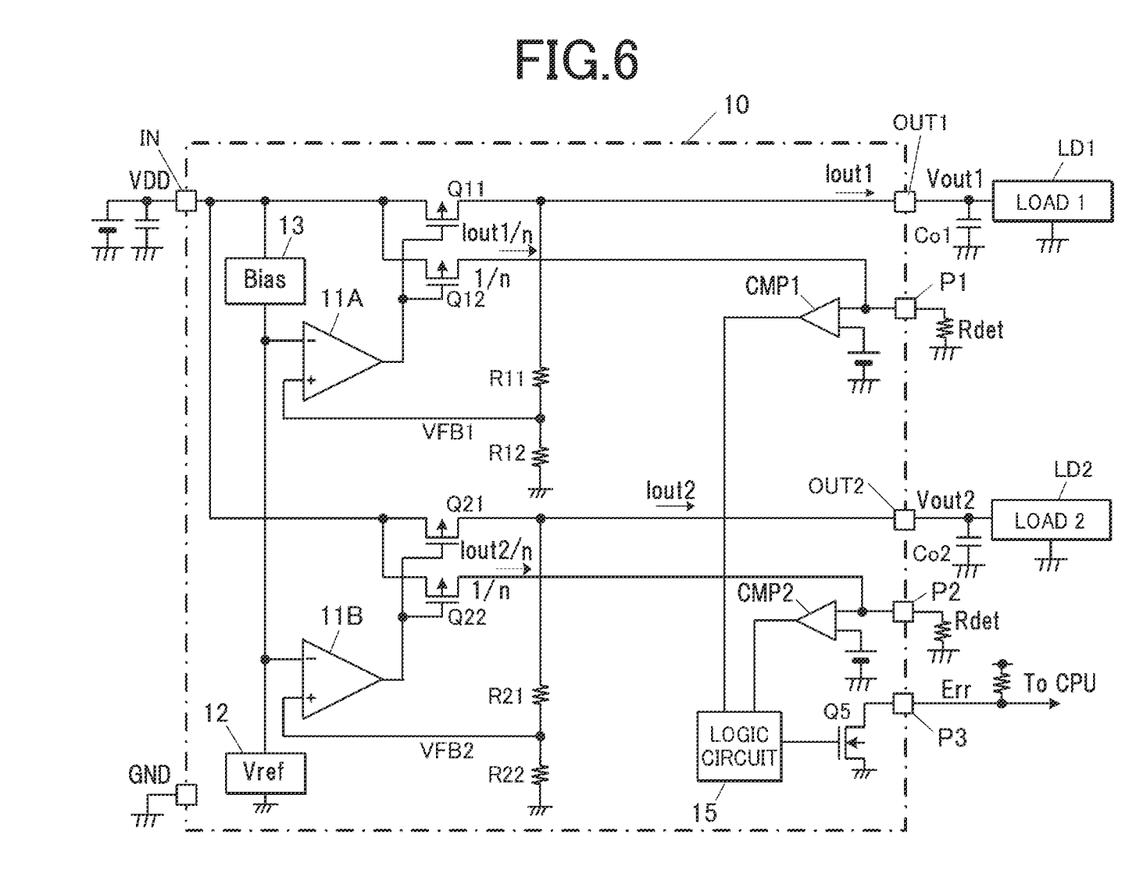
FIG. 6 is a circuit diagram showing an example of a regulator IC to which a known power supply IC is applied, the known power supply IC including circuits for detecting an open-circuit fault and short-circuit fault.

To deal with the above issue, a power supply IC as shown in FIG. 6 is conceived. The power supply IC includes two series regulators (LDOs) and two output terminals in one chip to supply electrical power to two loads. The power supply IC can detect an open/short circuit fault of the output terminals of the respective regulators. The power supply IC shown in FIG. 6 is conceived by the inventor of the present invention by the application of the open-circuit/short-circuit detection circuit in the power supply IC disclosed in JP2017-45096A and is not known to the public. Further, the regulator IC and the semiconductor device disclosed in JP2010-10527A and JP2017-45096A are supposed to be connected to one load.

Advantageously, the power supply IC shown in FIG. 6 can detect either open-circuit fault or short-circuit fault using different thresholds for the respective two output terminals. However, if such a power supply IC is applied to a regulator that supplies electrical power to two antennas in an on-vehicle DTTB system and if two loads having the same characteristic (e.g., diversity antenna) are connected to the two output terminals, there is no need to set different thresholds for the respective output terminals. In such a case, the power supply IC shown in FIG. 6 may have redundant terminals and external resistors, which may be disadvantageous in downsizing the IC and reducing cost.

The present invention has been conceived in view of the above issues. Objects of the present invention include providing a semiconductor integrated circuit that includes multiple output terminals for connection to multiple loads; that detects an open-circuit fault or a short-circuit fault occurred in any of the loads; and that outputs signals to notify the fault.

In order to achieve at least one of the above objects, according to an aspect of the present invention, there is provided a semiconductor integrated circuit including:
  one input terminal;
  multiple output terminals;
  multiple first current control elements that are connected between the input terminal and the respective output terminals;
  a control circuit that controls the first current control elements;
  a fault detection circuit that
    includes multiple voltage comparator circuits each of which compares a voltage proportional to a voltage of one of the output terminals with a predetermined threshold voltage and
    detects an open-circuit state or a short-circuit state of the respective output terminals;
  an external terminal for connection to an external resistor;
  a voltage convertor circuit that generates the predetermined threshold voltage according to a voltage of the external terminal, the voltage of the external terminal being generated by flowing a current through the external resistor, the threshold voltage being applied to an input terminal of each of the voltage comparator circuits; and
  a detection result output terminal for outputting a detection result by the fault detection circuit to outside.

BRIEF DESCRIPTION OF DRAWINGS

The accompanying drawings are not intended as a definition of the limits of the invention but illustrate embodiments of the invention, and together with the general description given above and the detailed description of the embodiments given below, serve to explain the principles of the invention, wherein.

DESCRIPTION OF EMBODIMENTS

Hereinafter, preferred embodiments of the present invention are described with reference to the drawings.

Figure 1:
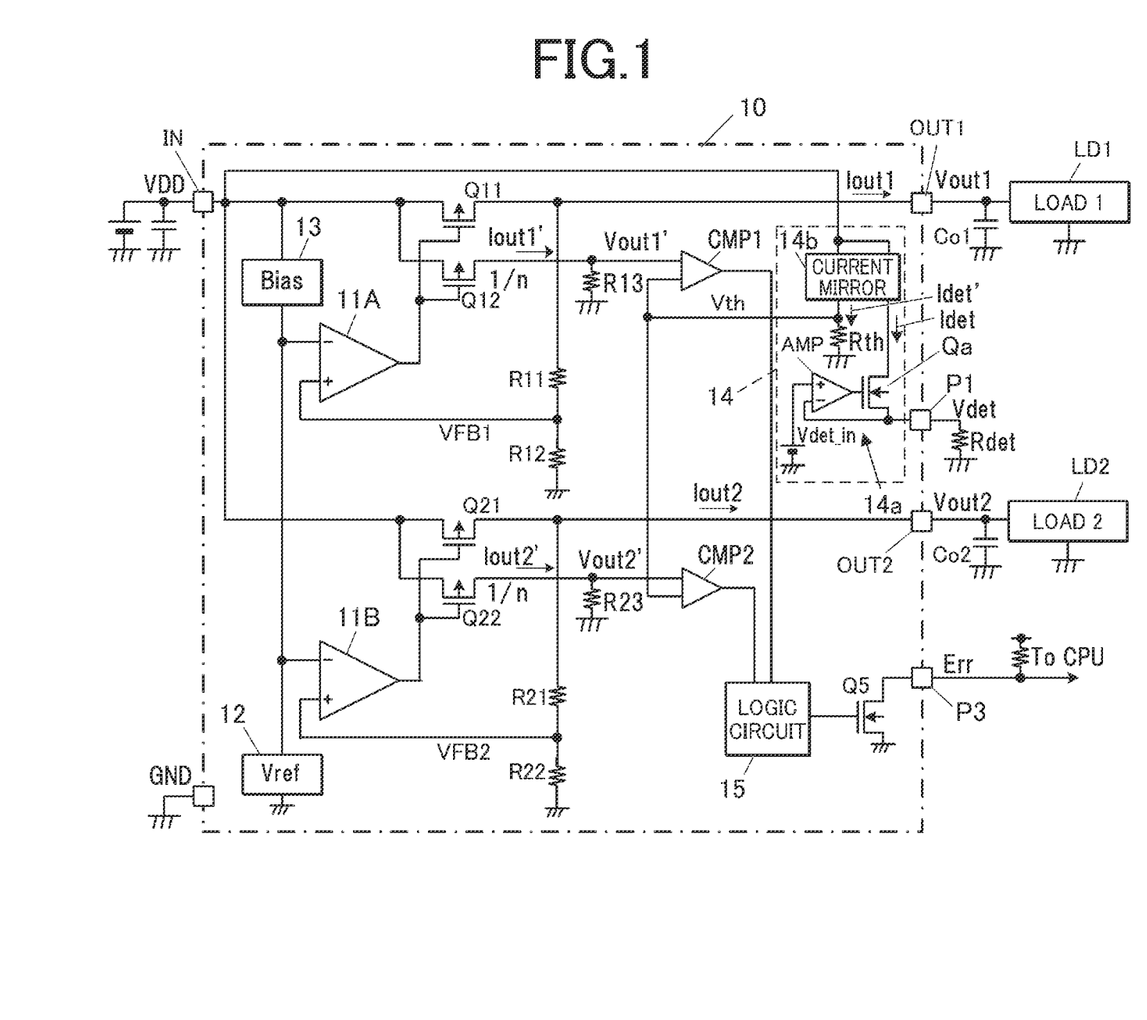
FIG. 1 is a circuit diagram of a regulator IC as a first embodiment of the present invention.

FIG. 1 is a first embodiment of the present invention, wherein the present invention is applied to a series regulator as a DC power supply device as an example. In FIG. 1, the part enclosed by the alternate long and short dash line is formed as a semiconductor integrated circuit (hereinafter, regulator IC) 10 formed on a semiconductor chip, such as a single crystal silicon.

As shown in FIG. 1, the regulator IC 10 in this embodiment includes one voltage input terminal IN to which a DC voltage VDD is applied; and two output terminals OUT1, OUT2 as external terminals. Between the voltage-input terminal IN and output terminal OUT1, a P-channel MOS transistor Q11 is connected. Between the voltage-input terminal IN and output terminal OUT1, a P-channel MOS transistor Q21 is connected. The output terminals OUT, OUT2 are connected to capacitors Co1, Co2, respectively. The regulator IC 10 thus functions as a DC power supply device that supplies two stable DC output voltages Vout1, Vout2 to the outside. LD1, LD2 are load devices such as antennas connected to the respective output terminals OUT1, OUT2.

Between the output terminal OUT1 and a ground line to which the ground electric potential GRD is applied, bleeder resistors R11, R12 are connected in series that divide the output voltage Vout1. Between the output terminal OUT2 and a ground line to which the ground electric potential GRD is applied, bleeder resistors R21, R22 are connected in series that divide the output voltage Vout2. When an external terminal is further connected to the middle point between the resistors R11 and R12 or between the resistors R21 and R22, the resistors R11, R12, R21, R22 can be provided outside the regulator IC 10.

The voltage VFB1 divided by the resistors R11, R12, which divide the output voltage, is applied as a feedback voltage to a non-inverting input terminal of an error amplifier 11A. The error amplifier 11A is an error amplifier circuit that controls the gate terminal of the transistor Q11. The voltage VFB2 divided by the resistors R21, R22 is applied as a feedback voltage to a non-inverting input terminal of an error amplifier 11B. The error amplifier 11B is an error amplifier circuit that controls the gate terminal of the transistor Q21. On the basis of the electric potential difference between the output feedback voltage VFB1/VFB2 and a predetermined reference voltage Vref, the error amplifier AMP1/AMP2 controls the output transistor Q11/Q21 to flow a current corresponding to the load, thereby regulating the output voltage Vout1/Vout2 to a desired potential. The transistors Q11, Q21 thus function as current control elements and voltage control elements.

The regulator IC 10 in this embodiment further includes: a reference voltage circuit 12 that generates a reference voltage Vref applied to inverting input terminals of the respective error amplifiers 11A, 11B; and a bias circuit 13 that supplies operation currents to the error amplifiers 11A, 11B and to the reference voltage circuit 12.

The reference voltage circuit 12 can be constituted of a bandgap reference circuit, resistors in series, or a Zener diode, for example.

The regulator IC 10 in this embodiment further includes: a transistor Q12 that is connected in parallel with the current control transistor Q11 and that constitutes a current mirror circuit of the transistor Q11; and a transistor Q22 that is connected in parallel with the current control transistor Q21 and that constitutes a current mirror circuit of the transistor Q21. The gate terminals (control terminals) of the transistors Q11, Q12 receive the same voltage, namely the voltage output by the error amplifier 11A. Similarly, the gate terminals of the transistors Q21, Q22 receive the same voltage, namely the voltage output by the error amplifier 11B. Accordingly, currents flowing through the transistors Q12, Q22 are proportional (1/N) to the drain currents of the respective transistors Q11, 21, depending on the element size ratio N between the transistor Q11/Q21 and the transistor Q12/22. When the transistors Q11, Q21 each consist of the same-sized N transistors connected in parallel (N: the number of transistors) and the transistors Q12, Q22 each consist of a single transistor, the currents are proportional to the number of elements.

The regulator IC 10 in this embodiment further includes resistors R13, R23 that are connected in series to the current mirror transistors Q12, Q22, respectively. The resistors R13, R23 convert currents flowing through the respective transistors Q12, Q22 into voltages, thereby functioning as current-voltage conversion elements.

The regulator IC 10 further includes: an external terminal P1 for connection to a resistor Rdet that converts voltages into currents outside the chip; a voltage converter 14 that generates the voltage Vth corresponding to the voltage Vdet at the external terminal P1; and comparators CMP1, CMP2. Each of the comparators CMP1, CMP2 compares the voltage Vth generated by the voltage converter 14 with the voltage converted by the resistors R13/R23 and detects either an open-circuit fault or a short-circuit fault of the output terminal OUT1/OUT2. Thus, the voltage Vth is a threshold for detecting an open-circuit fault or a short-circuit fault.

When either the output terminal OUT1 or OUT2 is open, very little current flows through the transistors Q11, 12 or transistors Q21, Q22, and the voltage of the resistor R13 or R23 becomes low. In order that the comparators CMP1, CMP2 function as open-circuit fault detection circuits, the resistor Rdet having a greater resistance value is connected to the external terminal P1 so that the voltage converter 14 generates a relatively low voltage Vtho for detecting an open-circuit fault.

On the other hand, when either the output terminal OUT1 or OUT2 is short-circuited, currents flowing through the transistors Q11, 12 or transistors Q21, Q22 is greater than the current flowing through the load, and the voltage of the resistor R13 or R23 becomes high. In order that the comparators CMP1, CMP2 function as short-circuit fault detection circuits, the resistor Rdet having a lower resistance value is connected to the external terminal P1 so that the voltage converter 14 generates a relatively high voltage Vths (>Vtho) for detecting a short-circuit fault.

Further, in order that the comparators CMP1, CMP2 function as open-circuit fault detection circuits, a voltage is generated at one input terminal (plus or minus) of each of the comparators CMP1, CMP2 by sending the current Iout1' from the transistor Q12 to the resistor R13 and by sending the current Iout2' from the transistor Q22 to the resistor R23; and the threshold voltage Vtho is generated at the other input terminal (minus or plus) of each of the comparators CMP1, CMP2. On the other hand, in order that the comparators CMP1, CMP2 function as short-circuit fault detection circuits, a voltage is generated at one input terminal (plus or minus) of each of the comparators CMP1, CMP2 by sending the current Iout1' from the transistor Q12 to the resistor R13 and by sending the current Iout2' from the transistor Q22 to the resistor R23; and the threshold voltage Vths is generated at the other input terminal (minus or plus) of each of the comparators CMP1, CMP2. The threshold voltage Vtho/Vths may be generated at either the inverting input terminals or the non-inverting input terminals (minus or plus) of the comparators CMP1, CMP2, depending on the logic of the logic circuit connected in the post stage. The above-described switching of inputs may be achieved by using mask options, which allows switching of input signal wires or logic circuits, for example. Further, the comparators CMP1, CMP2 may have hysteresis.

The regulator IC 10 in this embodiment further includes a logic circuit 15 that receives outputs of the comparators CMP1, CMP2 for detecting faults as inputs.

The regulator IC 10 further includes an N-channel MOS transistor Q5 that receives the output of the logic circuit 15 through the gate terminal. The regulator IC 10 further includes an external terminal P3 for outputting a fault detection signal Err to an external CPU or other devices through open drain outputs. The drain terminal of the transistor Q5 is connected to the external terminal P3. Instead of the open-drain transistor Q5, an output circuit consisting of a CMOS inverter may be used.

In a case where high level outputs of the comparators CMP1, CMP2 indicate fault states; and the logic circuit 15 outputs the fault states as a low-level fault detection signal Err, the logic circuit 15 is configured to have the OR logical function. In a case where low level outputs of the comparators CMP1, CMP2 indicate fault states; and the logic circuit 15 outputs the fault states as a low-level fault detection signal Err, the logic circuit 15 is configured to have the NAND logical function. In a case where low level outputs of the comparators CMP1, CMP2 indicate fault states; and the logic circuit 15 outputs the fault states as a high-level fault detection signal Err, the logic circuit 15 is configured to have the NOR logical function.

The regulator IC 10 may further include two external terminals for outputting fault detection signals and may output 2-bit false detection signals corresponding to the outputs of the comparators CMP1, CMP2 to the outside. In the case, the logic circuit 15 can be configured as a delay circuit, for example.

In the above description, input signal wirings of the comparators CMP1, CMP2 are configured to be switchable by mask options depending on which is detected, an open-circuit fault or a short-circuit fault of the output terminals OUT1, OUT2. Instead of switching input signal wirings of the comparators CMP1, CMP2, the logical configurations of the logic circuit 15 may be switched by mask options.

The voltage converter 14 includes a current buffer 14a that consists of an amplifier AMP and an N-channel MOS transistor Qa, as shown in FIG. 1. The inverting input terminal of the amplifier AMP is connected to the external terminal P1, which is connected to the resistor Rdet, and the non-inverting input terminal of the amplifier AMP receives the reference voltage Vdet_in. The source terminal of the transistor Qa is connected to the external terminal P1, and the gate terminal of the transistor Qa receives the voltage output by the amplifier AMP. The voltage converter 14 further includes a current mirror circuit 14b that turns back the current Idet generated by the current buffer 14a and sent to the resistor Rdet; and a resistor Rth that converts the secondary-side current (copy current) Idet' of the current mirror circuit 14b into a voltage. The voltage converted by the resistor Rth is supplied to the comparators CMP1, CMP2 as the comparison reference voltage Vth.

In the current buffer 14a of the voltage converter 14, the output terminal of the amplifier AMP is connected to the gate terminal of the transistor Qa, and the source terminal of the transistor Qa is connected to the inverting input terminal of the amplifier AMP. The amplifier AMP thus functions as a voltage follower and operates the transistor Qa such that the source voltage of the transistor Qa (the electric potential at the external terminal P1) is equal to the voltage input to the non-inverting input terminal (reference voltage Vdet_in).

Figure 2:
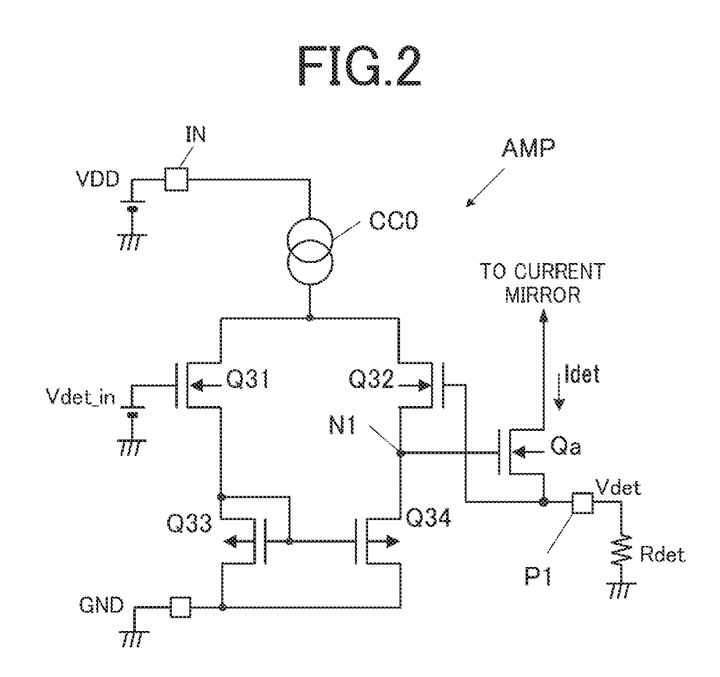
FIG. 2 is a circuit diagram showing a specific example of a current amplifier that constitutes a voltage converter in the regulator of the first embodiment shown in FIG. 1.

The amplifier AMP is a differential amplifier circuit that consists of differential input transistors Q31, Q32, active load transistors Q33, Q34, and a constant current source CC0, as shown in FIG. 2, for example. The gate terminal of the transistor Q31 receives the reference voltage Vdet_in, and the gate terminal of the transistor Q32 receives the voltage Vdet of the external terminal P1. The connecting node N1 connecting the transistor Q32 and Q34 is connected to the gate terminal of the transistor Qa. Thus, the amplifier AMP functions as a current buffer that sends a certain drain current to the transistor Qa. The circuit shown in FIG. 2 is an example and is not a limitation.

The characteristics of the voltage converter 14 are described.

The voltage converter 14 of this embodiment equalizes the voltage Vdet of the external terminal P1 to the reference voltage Vdet_in. That is, Vdet=Vdet_in holds. Therefore, the current Idet, which is sent from the current buffer 14a to the resistor Rdet, is expressed as follows.

$$Idet = Vdet/Rdet = Vdet\_in/Rdet$$

The current Idet is turned back as the current Idet' by the current mirror circuit 14b, and Idet' is sent to the resistor Rth and converted into the comparison reference voltage Vth by the resistor Rth. The generated comparison reference voltage Vth is expressed by the following equation (1), where m represents the current mirror ratio.

$$Vth = Rth*Idet' = Rth*Idet/m \qquad (1)$$

On the other hand, regarding the output current Iout1 from the output terminal OUT1, the current Iout' is generated by the current mirror (n) of the transistors Q11, Q12 and sent to the resistor R13 and converted into the voltage Vout1'. The voltage Vout1' is therefore expressed by the following equation (2).

$$Vout1' = R13 * Iout1y = R13 * Iout1/n \quad (2)$$

where n represents the ratio between Q11 and Q12.

The comparator CMP1 compares the voltage obtained from the equation (1) with the voltage obtained from the equation (2). When "Vout1' Vtho" holds, the comparator CMP1 determines that an open circuit occurs. When "Vout1' Vths" holds, the comparator CMP1 determines that a short circuit occurs. Therefore, by connecting the external resistor Rdet having a resistance value that satisfies "Vth=Vtho" to the external terminal P1, the comparator CMP1 can function as an open-circuit fault detector. Further, by connecting the external resistor Rdet having a resistance value that satisfies "Vth=Vths" to the external terminal P1, the comparator CMP1 can function as a short-circuit fault detection circuit.

Herein, the IC's internal resistors R13, Rth are both on-chip elements and therefore have a good relative ratio (around ±0.5%). This cancels variations in temperature characteristics caused by manufacturing variations.

On the other hand, the voltage converter 14 can generate an accurate reference voltage Vdet_in by using a band gap and so forth. Further, the external resistor Rdet, which generates the current Idet, is a discrete part and therefore can be manufactured with a good temperature characteristic and high accuracy (resistance accuracy: around +1%, temperature characteristic: around ±100 ppm/° C.). Accordingly, an accurate threshold voltage Vth can be generated, and open/short circuit faults can be detected at an increased accuracy.

The above description is also applied to the output current Iout2 of the output terminal OUT2. With the voltage converter 14 and the comparator CMP2, an open/short circuit fault can be detected accurately. When loads connected to the respective output terminals OUT1, OUT2 have the same characteristic and the same current flows through the loads, the comparators CMP1 and CMP2 can use the same comparison reference voltage Vth and share the voltage converter 14, as in the regulator IC 10 of this embodiment. Thus, with one external terminal P1 and one external resistor Rdet, the regulator IC 10 can set the comparison reference voltage Vth.

As described above, in a case where two equivalent loads are connected to the respective output terminals OUT1, OUT2, the regulator IC 10 in this embodiment can detect an open-circuit fault or a short-circuit fault with only one external terminal for connection to the external resistor Rdet. This allows downsizing of the chip. Further, the regulator IC with less terminals and less parts allows use of a compact and cheap package, thereby reducing space and cost for a power supply device.

Further, the threshold for detecting an open/short circuit fault can be easily changed by changing the resistance value of the external resistor Rdet. This allows the IC to have various uses.

Although not shown in FIG. 1, the regulator IC 10 may further include a current limit circuit that is connected to the gate terminals of the transistors Q11, Q21 and that limits output currents; and/or a thermal shutdown circuit that stops operation of the error amplifiers 11A, 11B to turn off the transistors Q11, Q21 when the chip temperature is equal to or greater than a predetermined temperature. The current limit circuit and the thermal shutdown circuit may supply their operation signals to the logic circuit 15. The logic circuit 15 may obtain a logical product of these signals and signals output by the comparators CMP1, CMP2; generate 2-bit or 3-bit fault detection signals Err; and output them outside the chip.

The regulator IC 10 may further include an external terminal CE that receives signals to turn on/off the operation of the IC, and the bias circuit 13 may be configured to supply and shut down bias currents to the error amplifiers 11A, 11B in accordance with a control signal input to the external terminal CE from a not-illustrated external microcomputer (CPU) or the like.

[Modification]

Figure 3:
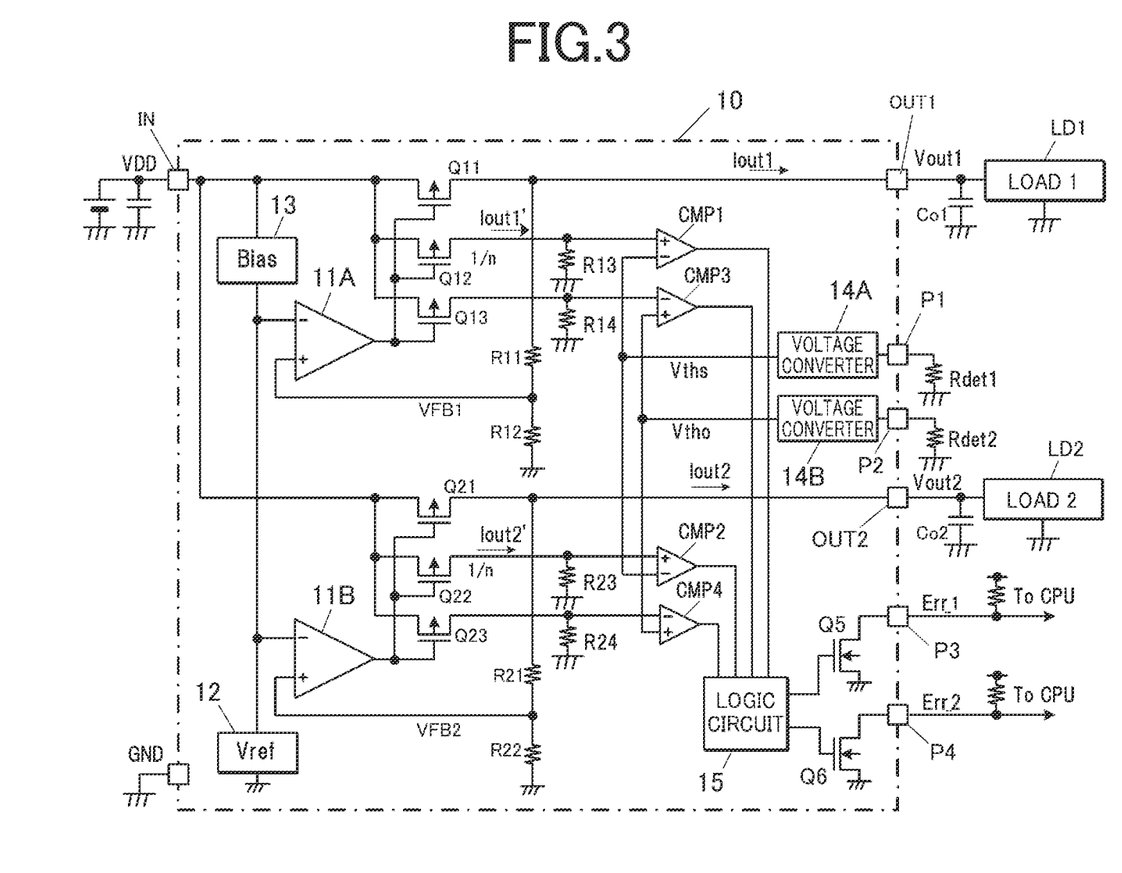
FIG. 3 is a circuit diagram of the regulator IC as a modification of the embodiment shown in FIG. 1.

Next, a modification of the regulator IC in the above embodiment is described with reference to FIG. 3.

The regulator IC of the above embodiment shown in FIG. 1 includes one external terminal P1 for connection to the external resistor Rdet and one voltage converter 14, and the regulator IC is configured to detect either an open circuit or a short circuit of two output terminals OUT1, OUT2 by using two comparators CMP1, CMP2. On the other hand, the regulator IC in this modification shown in FIG. 3 includes two external terminals for connection to external resistors Rdet1, Rdet2; two voltage converters 14A, 14B; and four comparators CMP1 to CMP4 for detecting both open and short circuits of the two output terminals OUT1, OUT2; and the logic circuit 15 outputs 2-bit fault detection signals Err.

Specifically, the regulator IC in this modification includes two transistors Q12, Q13 connected to the output-current control transistor Q11, which is connected to the output terminal OUT1. The transistors Q12, Q13 constitute current mirror circuits of the transistor Q11 and detect output currents. The regulator IC further includes two transistors Q22, Q23 connected to the output-current control transistor Q21, which is connected to the output terminal OUT2. The transistors Q22, Q23 constitute current mirror circuits of the transistor Q21 and detect output currents. Each of the transistors Q12, Q13 is connected in series to each of the on-chip resistors R13, R14 that convert currents into voltages. Each of the transistors Q22, Q23 is connected in series to each of the on-chip resistors R23, R24 that convert currents into voltages.

The regulator IC further includes external terminals P1, P2 for connection to the respective resistors Rdet1, Rdet2; and voltage converters 14A, 14B. Along with them, four comparators CMP1 to CMP4 are provided. The comparators CMP1, CMP2 compare the comparison reference voltage Vths for detecting a short circuit with the voltages converted by the respective resistors R13, R23. The comparators CMP3, CPM4 compare the comparison reference voltage Vtho for detecting an open circuit with the voltages converted by the respective resistors R14, R24.

The regulator IC further includes two open-drain output transistors Q5, Q6 that output fault detection signals and two external terminals P3, P4. The logic circuit 15 receives signals output by the comparators CMP1 to CMP4 and detects the following states: the state where one channel is open (one-channel open state); the state where two channels are open (two-channels open state); the state where one channel is short-circuited (one-channel short-circuited state); and the state where two channels are short-circuited (two-channels short-circuited state). The logic circuit 15 distinguishes these states and outputs 2-bit fault detection signals Err_1, Err_2 such that these states are distinguished from each other.

This modification may also include a current limit circuit that is connected to the gate terminals of the transistors Q11, Q21 and that limits output current and/or a thermal shutdown circuit. The current limit circuit and the thermal shutdown circuit may supply their operation signals to the logic circuit 15, and the logic circuit 15 may obtain a logical product of these signals and signals output by the comparators CMP1 to CMP4; generate 3-bit fault detection signals; and output the generated signals outside the chip.

Second Embodiment

Next, a second embodiment of the present invention is described with reference to FIG. 4 and FIG. 5.

This embodiment is the regulator IC 10 that includes one output terminal.

Figure 4:
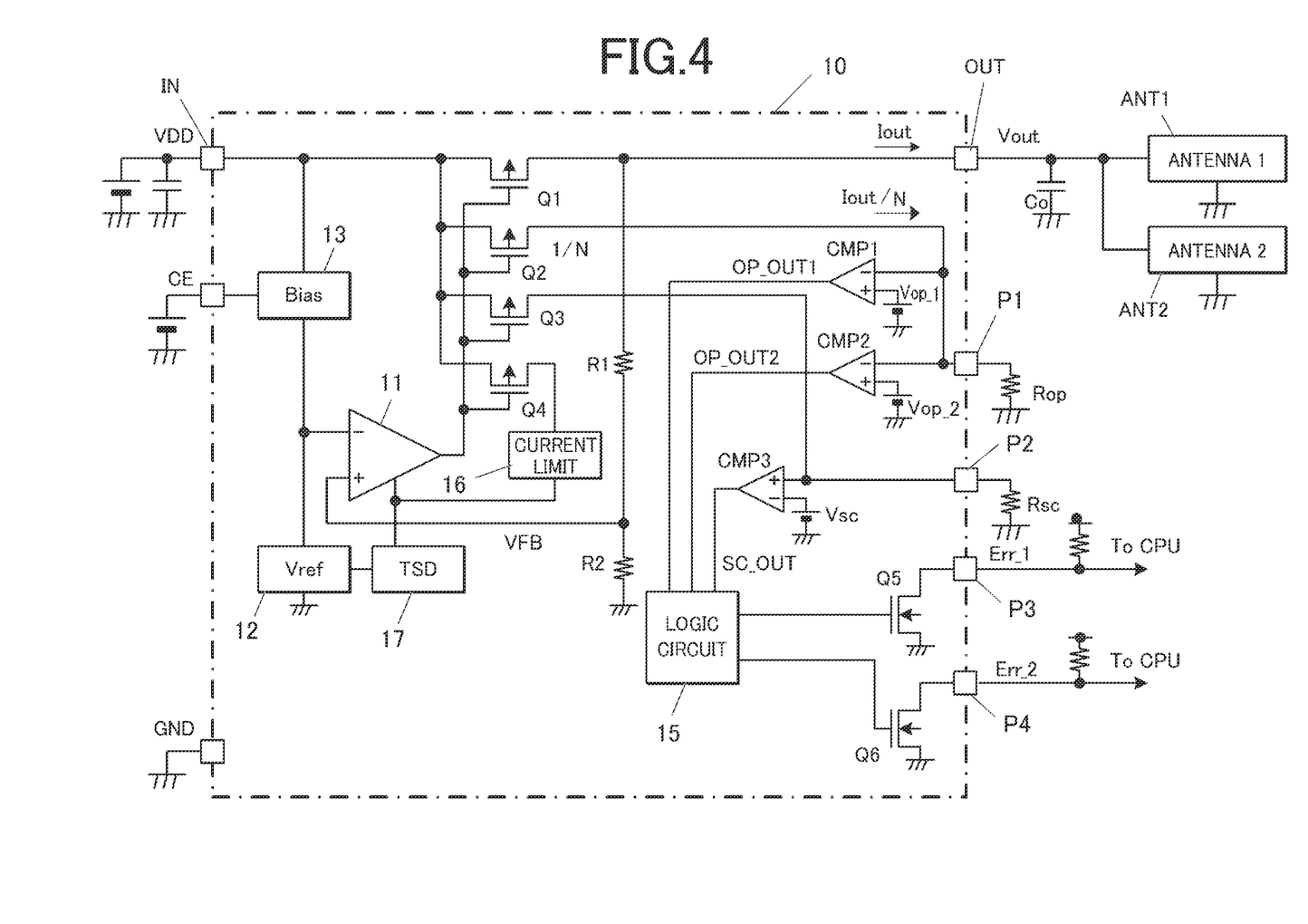
FIG. 4 is a circuit diagram of a regulator IC as a second embodiment of the present invention.

As shown in FIG. 4, the regulator IC 10 in this embodiment includes a voltage-control P-channel MOS transistor Q1 connected between a voltage-input terminal IN to which a DC voltage VDD is applied and an output terminal OUT; and bleeder resistors R1, R2 that divide an output voltage Vout and that is connected in series between the output terminal OUT and a ground line to which a ground potential GND is applied.

The voltage VFB divided by the resistors R1, R2 for dividing the output voltage is applied as a feedback voltage to a non-inverting input terminal of an error amplifier 11. The error amplifier 11 is an error amplifier circuit that controls the gate terminal of the voltage-control transistor Q1. On the basis of the electrical potential difference between the output feedback voltage VFB and a predetermined reference voltage Vref, the error amplifier 11 controls the voltage-control transistor Q1 and regulates the output voltage Vout to a desired potential.

In the regulator IC 10 in this embodiment, the characteristic and size of the voltage-control transistor Q1 is designed such that the transistor Q1 can send necessary currents to respective loads when two antennas ANT1, ANT2 are connected as loads to the output terminal OUT.

The regulator IC 10 in this embodiment further includes: a reference voltage circuit 12 that generates a reference voltage Vref to be applied to the inverting input terminal of the error amplifier 11; a bias circuit 13 that supplies operation currents to the error amplifier 11 and to the reference voltage circuit 12; and a logic circuit 15. The regulator IC 10 further includes: a current limit circuit 16 that is connected to the gate terminal of the voltage-control transistor Q1 and that limits output currents; a thermal shutdown (TSD) circuit 17 that stops operation of the error amplifier 11 to turn off the transistor Q1 when the chip temperature is equal to or higher than a predetermined temperature; and an external terminal CE that receives signals for turning on/off the operation of the IC.

The reference voltage circuit 12 can be constituted of a bandgap reference circuit, resistors in series, or a Zener diode, for example. The bias circuit 13 is configured to supply and shut down bias currents to the error amplifier 11 in accordance with control signals input to the external terminal CE from an external microcomputer (CPU) or the like. When the output current Tout increases (e.g., owing to a fault in the load) and the output voltage decreases, the error amplifier 11 decreases the gate voltage of the transistor Q1 so that more currents flow through the transistor Q1. In such a case, the current limit circuit 14 limits the output current Tout by clamping so that a drain current does not increase to or greater than a predetermined level. The output current Tout flows as consumption currents Icc through the antennas ANT1, ANT2, which are connected to the output terminal OUT as loads.

The regulator IC 10 in this embodiment further includes transistors Q2, Q3, Q4 that are connected in parallel with the voltage-control transistor Q1 and that constitute current mirror circuits of the transistor Q1. The gate terminals (control terminals) of the transistors Q2 to Q4 receive the same voltage as the voltage applied to the gate terminal of the voltage-control transistor Q1. Accordingly, currents flowing through the transistors Q2 to Q4 are proportional (1/N) to the drain current of the transistor Q1, depending on the element size ratio N between the transistor Q2/Q3/Q4 and the transistor Q1. When the transistor Q1 consists of N transistors of the same size connected in parallel (N: the number of transistors) and the transistors Q2 to Q4 each consist of a single transistor, the currents are proportional to the number of elements.

The regulator IC 10 in this embodiment further includes external terminals P1, P2. The external terminal P1 is for connection to a resistor Rop that converts currents into voltages outside the chip. The external terminal P2 is for connection to a resistor Rsc. The drain terminal of the current-mirror transistor Q2 is connected to the external terminal P1. The drain terminal of the current-mirror transistor Q3 is connected to the external terminal P2.

The regulator IC 10 further includes comparators CMP1, CMP2 for detecting an open-circuit fault and a comparator CMP3 for detecting a short-circuit fault. The inverting input terminals of the respective comparators CMP1, CMP2 are connected to the external terminal P1, and the non-inverting input terminals of the comparators CMP1, CMP2 receive reference voltages Vop1, Vop2, respectively (Vop1>Vop2). The non-inverting input terminal of the comparator CMP3 is connected to the external terminal P2, and the inverting input terminal of the comparator CMP3 receives the reference voltage Vsc. The comparators CMP1, CMP2 for detecting an open-circuit fault and the comparator CMP3 for detecting a short-circuit fault have hysteresis. This, however, does not limit the present invention.

The resistance value of the external resistor Rop is set such that the voltage across the terminals of the resistor Rop equals the reference voltages Vop1, Vop2 when a relatively small detection current indicating an open-circuit fault flows through the current-mirror transistor Q2. The setting of the reference voltages Vop_1, Vop_2 is described in detail later. The resistance value of the external resistor Rsc is set such that the voltage across the terminals of the resistor Rsc equals the reference voltage Vsc when a relatively large detection current indicating a short-circuit fault flows through the current mirror transistor Q3.

When either one of two antennas connected to the output terminal OUT is disconnected or its wires are broken, the currents flowing through the voltage-control transistor Q1 and the current-mirror transistor Q2 decrease, and OP_OUT1 output by the comparator CMP1 changes from low level (L) to high level (H). When both of two antennas ares disconnected and the currents flowing through the voltage-control transistor Q1 and the current-mirror transistor Q2 further decrease, OP_OUT1 output by the comparator CMP1 and OP_OUT2 output by the comparator CMP2 both change from low level (L) to high level (H). Accordingly, open-circuit faults can be detected.

As described above, in this embodiment, current values for detecting an open-circuit fault and a short-circuit fault are determined by the respective external resistors Rop, Rsc. The current values (thresholds) for detection can therefore be set as desired, depending on a system used. The same voltage value may be used for (i) either the reference voltage Vop_1 for the comparator CMP1 or the reference voltage Vop_2 for the comparator CMP2 and (ii) the reference voltage Vsc for the comparator CMP3.

The regulator IC 10 in this embodiment further includes the logic circuit 15 that receives OP_OUT1, OP_OUT2 output by the respective open-circuit fault detection comparators CMP1, CMP2 and SC_OUT output by the short-circuit fault detection comparator CMP3 as inputs.

The regulator IC 10 further includes N-channel MOS transistors Q5, Q6 the gate terminals of which receive the output of the logic circuit 15. The regulator IC 10 further includes external terminals P3, P4 for outputting fault detection signals Err_1, Err_2 to an external CPU or other devices thorough open drain outputs. The drain terminal of the transistor Q5 is connected to the external terminal P3, and the drain terminal of the transistor Q6 is connected to the external terminal P4.

TABLE 1 is the truth table showing combinations of states of the output terminal OUT; outputs of the comparators CMP1 to CMP3 OP_OUT1, OP_OUT2, SC_OUT; and fault detection signals Err_1, Err_2. The logic circuit 15 is configured to output signals that drive the transistors Q5, Q6 to output a combination of fault detection signals Err_1, Err_2 as shown in TABLE 1 in response receiving to a combination of OP_OUT1, OP_OUT2, SC_OUT as shown in TABLE 1. TABLE 1 is an example of the truth table and not a limitation.

TABLE I

| OPERATION STATE | OP_OUT1 | OP_OUT2 | SC_OUT | Err_1 | Err_2 |
|---|---|---|---|---|---|
| NORMAL | L | L | L | H | H |
| 1ch OPEN | H | L | L | L | H |
| 2ch OPEN | H | H | L | H | L |
| SHORT | L | L | H | L | L |

As shown in TABLE 1, the regulator IC 10 in this embodiment can output 2-bit fault detection signals Err_1, Err_2 such that the one-channel open state (either the antenna ANT1 or ANT2 is disconnected from the output terminal OUT), the two-channels open state (both ANT1 and ANT2 are disconnected), and the short-circuited state (either ANT1 or ANT2 is short-circuited) are distinguished from each other. Thus, the regulator IC 10 can notify the open/short circuit state to the CPU and so forth. Thus, the regulator IC including a circuit for detecting an open-circuit fault of the output terminal and a circuit for detecting a short-circuit fault of the output terminal can output fault detection results such that the detection results are distinguished from each other by using a small number of external terminals.

In the regulator IC 10 that detects faults as described above in this embodiment, the reference voltages Vop_1, Vop_2 for the open-circuit fault detection comparators CMP1, CMP2 are set as follows.

In a case where two comparators CMP1, CMP2 are used to detect one-channel open state and two-channels open state, if the consumption currents ICC through the load antennas ANT, ANT2 vary greatly, it is difficult to distinguish between these fault states in detection. To deal with this, the variation range of the consumption currents Icc is considered for distinguishing between two open states in detection.

TABLE 2 shows combinations of the minimum value (Min), the median (Typ), and the maximum value (Max) of the consumption current Icc when one antenna is connected (1 ch) and when two antennas are connected (2 ch). "±a %" represents variation of the consumption current Icc in one antenna.

TABLE 2

| | NUMBER OF CHANNELS | Min | Typ | Max |
|---|---|---|---|---|
| CONSUMPTION CURRENT | 1ch | Icc − a % | Icc | Icc + a % |
| | 2ch | (Icc − a %) × 2 | Icc × 2 | (Icc + a %) × 2 |

As shown in TABLE 2, the consumption current when two antennas are connected (2 ch) is twice as large as the consumption current when one antenna is connected (1 ch).

Figure 5:
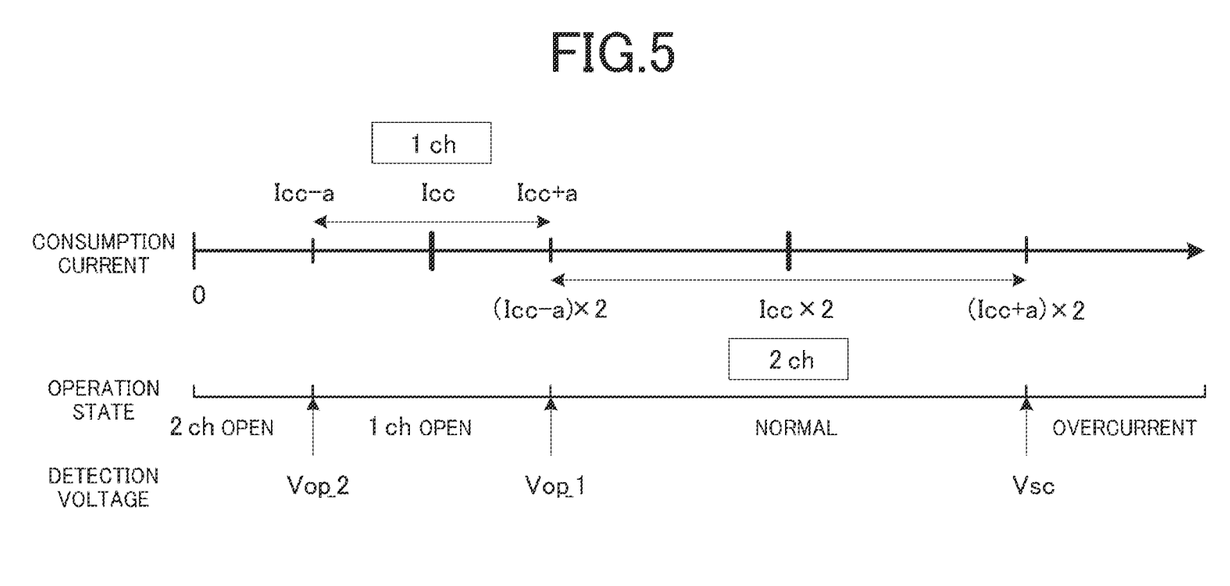
FIG. 5 is a diagram showing the relation between consumption currents through two channel antennas and the state of the output terminal in a case where the variation of consumption current in one antenna a is 33%.

FIG. 5 shows relations between consumption currents through two antennas (2 ch) and states of the output terminals when the consumption current variation "a" in one antenna is 33%. As shown in FIG. 5, when Icc+a % (maximum value of the consumption current when one antenna is connected (1 ch)) is smaller than (Icc−a %)×2 (minimum value of the consumption current when two antennas are connected (2 ch)), the threshold Vop_1 is set to a voltage corresponding to the boundary between Icc+a % and (Icc−a %)×2. Accordingly, the IC can distinguish between the normal state of the output terminal and the fault state of the output terminal (either one of antennas is disconnected (1 ch open)) in detection.

Specifically, the current flowing through the current mirror transistor Q2, to which the external resistor Rop is connected in series, is 1/N of the current flowing through the voltage-control transistor Q1. Therefore, by setting the threshold voltage Vop_1 to Rop×(Icc+a %)/N, the IC can distinguish between the state when the output terminal is normal and the state where one channel antenna is open in detection.

Herein, the variation "a" is obtained by the following equation.

$$Icc(1+a/100)=Icc(1-a/100)\times 2$$

The equation yields a=100/3≈33.3%. This shows that, when two antennas are connected (2 ch) and the variation of the consumption current Icc is within ±33.3%, the IC can distinguish between the state where the output terminal is normal and the state where any one of antennas is open (1 ch open) in detection.

Further, in FIG. 5, Vop_2 is set to a voltage corresponding to the consumption current (Icc−a %). Specifically, the threshold voltage Vop_2 is set to Rop×(Icc−a %)/N. This allows the IC to distinguish between the state where any one of antennas is disconnected (1 ch open) and the state where two antennas are disconnected (2 ch open) in detection.

When the antennas in use are changed and the consumption currents Icc flowing through antennas change, the resistance value of the external resistor Rop connected to the external terminal P1 can be adjusted. Accordingly, the open-circuit state of the output terminal can be detected on the same principle as described above.

Herein, the consumption current variation "a" (approximately 33.3%) is applied when two loads (antennas) are connected to the output terminal OUT. When N antennas are connected (N ch), the consumption current variation can be generalized by the following equation.

$$a=100\div\{n\times(n+1)\div 2\}$$

According to the above equation, when three antennas are connected (3 ch), the variation range of consumption current in which the open-circuit fault is distinguishable is approximately within ±16.6%; when four antennas are connected (4 ch), the variation range of consumption current in which the open-circuit fault is distinguishable is within ±10%. In the above, three or four comparators are required for detecting open-circuit faults for the respective cases, and fault detection signals having three bits or more are output.

Thus, when the consumption current variation "a" satisfies the above-described condition, the regulator IC in this embodiment can send currents to a desired number of antennas that are connected to the output terminal OUT and that have the same consumption current. Such a regulator IC can avoid cost increase owing to multiple regulators for multiple antennas and can detect an open-circuit state(s), which occur when any one of antennas is disconnected or when wires break in an antenna(s).

As described above, the regulator IC 10 in this embodiment can flow currents to two antennas connected to the output terminal OUT. Further, the regulator IC 10 can output 2-bit fault detection signals Err_1, Err_2 such that the following states are distinguished from each other: the one-channel open state (either one of two antennas is disconnected), the two-channels open state (two antennas are both disconnected); and the short-circuited state (either one of two antennas is short-circuited). The regulator IC 10 can notify these states to the CPU or the like.

Such a regulator IC can reduce cost, mounting area, and power consumption as compared with a configuration having multiple regulators for respective antennas, as well as retaining the ability to detect open and short circuit faults. Therefore, for on-vehicle 4-channel DTTB antennas compatible with full segment digital broadcasting, only two regulator ICs are required. Further, the regulator IC can distinguish among three fault states using 2-bit fault detection signals. Such a regulator IC requires less terminals and allows use of compact and cheap package, thereby achieving cost reduction.

Instead of the comparators CMP1, CMP2 for open-circuit fault detection in the regulator IC, an A/D converter may be provided in the microcomputer. In the case, the microcomputer may receive the voltage of the external terminal P1 connected to the resistor Rop and detect an open-circuit fault. On the other hand, the above embodiment, which outputs 2-bit fault detection signals Err_1, Err_2, does not need an A/D converter in the I/O section of the microcomputer and does not need setting of threshold values for detection. The above embodiment is therefore advantageous in system designing.

In a case where loads connected to the output terminal are antennas connected to an on-vehicle DTTB tuner, the antennas are relatively more likely to detach by vibration of the vehicle. In the case, a power supply device that uses the power supply semiconductor IC in the above embodiment can supply currents to the antennas and can distinguish between the open-circuit state of either one of the antennas and the short-circuit state of all the antennas in detection.

[Modification]

The regulator IC in the second embodiment shown in FIG. 4 detects the one-channel open state, the two-channels open state, and the short-circuited state and outputs 2-bit fault detection signals Err_1, Err_2 such that these states are distinguished from each other. However, the short-circuit detection function (comparator CMP3) may be omitted. In a case where the short-circuit detection function is omitted, the logic circuit 15 may also be omitted, and the outputs of the open-circuit fault detection comparators CMP1, CMP2 may be directly input to the gate terminals of the transistors Q5, Q6. Alternatively, a simple circuit, such as a delay circuit or a buffer, may be provided instead of the logic circuit 15, and the outputs thereof may be input to the gate terminals of the transistors Q5, Q6.

In a case where the short-circuit detection function is omitted, the output of the thermal shutdown (TSD) circuit 17 TSD_OUT may be input to the logic circuit 15; the logic circuit 15 may calculate a logical product of TSD_OUT and the outputs of the open-circuit fault detection comparators CMP1, CMP2; and the logic circuit 15 may generate signals corresponding to the logical product and output the generated signals as 2-bit fault detection signals Err_1, Err_2. In the case, "SHORT" in TABLE 1 is replaced with "TSD operation".

The regulator IC in the second embodiment (FIG. 4) is configured as an on-vehicle power supply device for digital terrestrial television broadcasting that is connected to load antennas via the output terminal OUT, as an example. However, the loads are not limited to antennas. The regulator IC is also applicable to a power supply device that is connected to two or more loads through which the same consumption current flows. Further, in a case where there are two different types of loads through which different consumption currents flow, the regulator IC may be used as a power supply device connected to the two different loads via the output terminal OUT as long as the following condition is met: the minimum of the total consumption current variation when two loads are regularly connected does not overlap the maximum of the consumption current variation when either one of loads is disconnected (including break of wires).

Although the present invention has been described in detail on the basis of the embodiments, the present invention is not limited to the disclosed embodiments. For example, although the above embodiments use MOS transistors as transistors constituting internal circuits of the regulator IC 10, bipolar transistors may be used instead of MOS transistors.

The regulator IC in the above embodiments is configured as an on-vehicle power supply device for digital terrestrial television broadcasting that is connected via the output terminal OUT to load antennas as an example. However, the loads are not limited to antennas. The regulator IC is also applicable to a power supply device that is connected to two or more loads that flow the same consumption current.

Further, although the present invention is applied to a regulator IC in the above embodiments, the present invention is not limited to a regulator IC but is also applicable to an IC that constitutes a switching-regulator type DC-DC converter or a high-side switch IC.

What is claimed is:
1. A power supply device comprising:
one input terminal;
multiple output terminals;
multiple first current control elements that are connected between the input terminal and a respective multiple output terminals;
a control circuit that controls the multiple first current control elements;
a fault detection circuit that includes multiple voltage comparator circuits each of which compares a voltage proportional to a voltage of one of the multiple output terminals with a predetermined threshold voltage and detects a fault state that is an open-circuit state or a short-circuit state of the respective multiple output terminals; and a voltage convertor circuit that generates the predetermined threshold voltage according to an electric potential difference of a current setting resistor, the electric potential difference being generated by flowing a current through the current setting resistor, the predetermined threshold voltage being applied to an input terminal of each of the multiple voltage comparator circuits, wherein the fault state detected by the fault detection circuit is notified to outside.

2. The power supply device according to claim 1, wherein the fault detection circuit includes:

multiple second current control elements that flow currents proportionally smaller than currents through respective multiple first current control elements; and multiple current-voltage conversion elements that convert currents flowing through the respective second current control elements into voltages, wherein the multiple voltage comparator circuits compare voltages converted by respective multiple current-voltage conversion elements with the predetermined threshold voltage and output the comparison results.

3. The power supply device according to claim 1, wherein the voltage convertor circuit includes:

a voltage-current convertor circuit that generates a current corresponding to the current setting resistor;

a current mirror circuit that copies the current generated by the voltage-current convertor circuit; and a current-voltage conversion element that converts a current output by the current mirror circuit into a voltage.

4. The power supply device according to claim 3, wherein a first terminal of the current setting resistor is connected to a ground potential.

5. The power supply device according to claim 4, wherein the voltage-current convertor circuit includes:

a differential amplifier circuit, an inverting input terminal of the differential amplifier circuit receiving a voltage of a second terminal of the current setting resistor, a non-inverting input terminal of the differential amplifier circuit receiving a predetermined constant voltage; and a transistor, a source terminal of the transistor being connected to the second terminal of the current setting resistor, a gate terminal of the transistor receiving a voltage output by the differential amplifier circuit, a drain terminal of the transistor being connected to the current mirror circuit.

6. The power supply device according to claim 1, further comprising:

two voltage convertor circuits each of which is the voltage convertor circuit, wherein one of the two voltage convertor circuits generates the predetermined threshold voltage for detecting an open-circuit state of the output terminals, and wherein another of the two voltage convertor circuits generates the threshold voltage for detecting a short-circuit state of the multiple output terminals.

7. The power supply device according to claim 1, further comprising:

multiple detection result output terminals each of which notifies the fault state to outside; and a logic circuit that receives signals output by the multiple voltage comparator circuits and generates output signals having multiple bits to be output from the multiple detection result output terminals to outside, the output signals being generated such that the open-circuit state and the short-circuit state of the respective multiple output terminals are distinguished from each other.

8. The power supply device according to claim 1, wherein a load is connected to each of the multiple output terminals via a connector, the load being a tuner or an antenna.

9. The power supply device according to claim 1, wherein the current changes depending on the current setting resistor, wherein, upon generation of low threshold voltage in response to setting of large resistance of the current setting resistor, the open-circuit state is detected, and wherein, upon generation of high threshold voltage in response to setting of small resistance of the current setting resistor, the short-circuit state is detected.

* * * * *

UNITED STATES PATENT AND TRADEMARK OFFICE
CERTIFICATE OF CORRECTION

PATENT NO. : 12,072,375 B2
APPLICATION NO. : 18/462639
DATED : August 27, 2024
INVENTOR(S) : Yoichi Takano It is certified that error appears in the above-identified patent and that said Letters Patent is hereby corrected as shown below:

In the Claims

In Column 15, Lines 5-6, in Claim 1, delete "the predetermined" and insert -- and the predetermined -- therefore.
In Column 15, Line 12, in Claim 2, delete "the fault detection circuit includes:" and insert -- the fault detection circuit further includes: -- therefore.
In Column 15, Lines 41-42, in Claim 5, delete "; and" and insert -- , -- therefore.
In Column 16, Lines 4-5, in Claim 5, delete "a drain terminal" and insert -- , and a drain terminal -- therefore.
In Column 16, Line 15, in Claim 6, delete "the threshold voltage" and insert -- the predetermined threshold voltage -- therefore.

Signed and Sealed this
Fifteenth Day of October, 2024

Katherine Kelly Vidal
*Director of the United States Patent and Trademark Office*